United States Patent [19]
Rieken et al.

[11] Patent Number: 6,094,331
[45] Date of Patent: Jul. 25, 2000

[54] ARRANGEMENT FOR CONNECTION OF A MODULE IN AN APPLIANCE

[75] Inventors: Ralf Rieken, Horn-Bad Meinberg; Helmut Flotho, Fürstenberg, both of Germany

[73] Assignee: Siemens Nixdorf Informationssysteme AG, Paderborn, Germany

[21] Appl. No.: 09/171,513

[22] PCT Filed: Aug. 6, 1997

[86] PCT No.: PCT/DE97/01654

§ 371 Date: Oct. 20, 1998

§ 102(e) Date: Oct. 20, 1998

[87] PCT Pub. No.: WO98/12614

PCT Pub. Date: Mar. 26, 1998

[30] Foreign Application Priority Data

Sep. 18, 1996 [DE] Germany ............... 196 38 167

[51] Int. Cl.$^7$ ............................................. H02H 3/00
[52] U.S. Cl. ..................... 361/93.1; 361/58; 361/115; 361/118
[58] Field of Search .................. 361/93.1, 115, 361/58, 118

[56] References Cited

U.S. PATENT DOCUMENTS

| | | | |
|---|---|---|---|
| 4,245,270 | 1/1981 | Busby | 361/58 |
| 5,010,293 | 4/1991 | Ellersick | 323/278 |
| 5,210,855 | 5/1993 | Bartol | 395/500 |

FOREIGN PATENT DOCUMENTS

| | | | |
|---|---|---|---|
| 34 02 845 A1 | 8/1985 | Germany | H05M 5/00 |
| 39 26 352 A1 | 3/1990 | Germany | G05F 1/573 |
| 39 42 480 A1 | 6/1991 | Germany | H05M 5/00 |

OTHER PUBLICATIONS

Machine Design, vol. 62, No. 24, Nov. 22, 1990, James D. Herard, "Taking the ZAP out of hot plugging", pp. 46–49.

Patent Abstracts of Japan; E–966, Aug. 17, 1990, vol. 14, No. 383, Electronic Circuit Board & JP 2–139996, dated May 29, 1990.

Schroff, 19" Aufbausysteme für die Elektronik, Katalog, Oct. 1986, S. 4,5, G44, G45.

*Primary Examiner*—Stephen W. Jackson
*Attorney, Agent, or Firm*—Hill & Simpson

[57] ABSTRACT

The arrangement connects at least one module (M) to a power supply unit (SV) in an apparatus in such a way that a connection is provided when the power supply unit (SV) is switched on. In the apparatus is a contact element (KG, VE) which is located outside the module and has leading contacts and a device for current limitation (AS) of an initial current flow.

15 Claims, 4 Drawing Sheets

ARRANGEMENT FOR CONNECTION OF A MODULE IN AN APPLIANCE

BACKGROUND OF THE INVENTION

The invention relates to an arrangement for connecting a module to a switched-on supply voltage in the case of an apparatus of modular construction, in particular a computer.

Many electric apparatuses are nowadays of modular construction, that is to say they comprise a plurality of functional units which are constructed as self-contained modules and can be exchanged easily and individually, an apparatus functioning fully only once these functional units cooperate inside it.

By contrast with a monolithic structure of "one piece", or a plurality of parts firmly connected to one another, the construction of an apparatus using modular technology exhibits a range of advantages. Thus, in the case of a defect, for example, it is not necessary to exchange the entire apparatus or at least large parts thereof, it being sufficient instead to replace only the defective module. Since, as a rule, the individual modules are installed in the apparatus via plug-in, latching or screwed connections, it is therefore possible for an exchange to be carried out quickly and simply, that is to say frequently also by a person not skilled in the art. Relevant examples here are the "plug-in cards" (graphics cards, sound cards, network cards etc.) or memory modules which are installed in so called slots in a personal computer and can mostly be installed or exchanged by the users themselves.

Some apparatuses often need to provide particularly high operational reliability, that is to say protection against partial, or even complete, failure. This is the case, inter alia, for telephone exchanges, security systems and also in computers. If, for example, the computer of a retail company or of a mail order firm fails for just one day, it is not usually possible to invoice on that day, that is to say payments both in and out are blocked and the company is therefore unable to pay for this period. Such a situation could result in serious consequences for many companies.

The required operational reliability of such apparatuses is mostly achieved by all the important functional units of the apparatus being constructed as easily exchangeable modules which are best also redundant, that is to say a number of them are present as reserves. If a defect then occurs in a module, an automatic switchover is made to one of the reserve modules without the need to interrupt operation of the apparatus for this purpose or to restrict the scope of operation. If the defective module is not present in a redundant fashion, the apparatus initially likewise continues to remain in operation as far as possible, but without in this case having recourse to the functions of the module to be exchanged. As a rule, a defective module is indicated by the apparatus, so that it can be repaired or replaced by a new module. In this case, the defective module is removed and the repaired or new module is installed in a "live" fashion, that is to say while the apparatus and the terminal of the module therein continue to be supplied with voltage. In order in this case to avoid malfunctions, for example loss of data in a computer, it is indeed necessary as a rule to shut down the operational environment of the module to be exchanged, that is to say the system bus, for example, for the short duration of the exchange, as a result of which the apparatus is only operational to a limited extent during this time. However, the system (apparatus) as a whole need not be switched off, but can, for example, remain on standby. For this reason use is made of the terms "Online Replacement (OLR)" and "Live Insertion" of modules. The abbreviation "OLR" is used below for these.

the supply currents possible in this case immediately after the (re)installation of a module frequently greatly exceed the strength of the currents absorbed by the module in normal operation. The chief reason for this is that it is usually necessary first of all for capacitors (for example stabilization capacitors) to be charged up in the module before the current absorbed is reduced to the amount which is normal for operating the module. These short term current peaks occurring during installation of the module are problematic if the module itself or other parts of the apparatus can be damaged thereby, or if the voltage supply of other parts/modules of the apparatus thereby drops briefly to such an extent that correct functioning thereof is limited or even becomes impossible (some components, for example memories or counters, react to a drop in their supply voltage below a specific threshold value by resetting and thus losing data).

In order to avoid excessively high currents during online replacement of modules, the supply inputs of the appropriate modules are mostly protected in practice by current-limiting components, for example ohmic series resistors. The higher the maximum permissible current strength turns out to be in this case, the more space is usually required by the current-limiting components in the module. In the case of powerful computers, the maximum current strength may be, for example, ~100A or more, the result being that the OLR current limitation requires a substantial amount of space in the modules for the components which are to be dimensioned correspondingly. However, this limits the packing density of a plurality of modules in the apparatus. p Laid-open patent application DE 34 02 845 A1 discloses a plug-in module with leading contacts, in which a series resistor is provided on the module for current limitation.

The publication "Taking the zap out of hot plugging" by J. D. Herard, Machine Design, Vol. 63, No. 24, pages 46, 48, 50, 54 dated Nov. 22, 1990 provides a general treatment of the problem of current impulses in the case of online replacement and generally proposes leading contacts and devices for current limitation, without specifying concrete embodiments.

Document DE-A-3 926 352 shows a device for current limitation, without the latter being bridged by a contact element.

SUMMARY OF THE INVENTION

It is the object of the invention to specify an arrangement, provided for online replacement, for connecting a module to the power supply unit of an apparatus, in which arrangement the space required to be provided in the module for this is minimized.

In this case, the module is connected to the power supply unit of the apparatus via a device external for the module. The current limitation serves in this case to prevent damage to the apparatus of a module by high current peaks which occur briefly during installation of the module.

By contrast with conventional solutions, such an arrangement for connecting a module to the power supply unit in an apparatus has the advantage that arranging the device for current limitation outside the module conspicuously reduces the space required for OLR in the module. Consequently, the dimensions of the module can be reduced, and a relatively high packing density of several modules can be achieved in the apparatus. By contrast, given the cavities provided in the apparatus, inter alia for cooling purposes, there is enough space available there to accommodate the current-limiting components. The fact that it is possible to make use of modules (for example lightest part) which, in the absence of the dedicated current-limiting arrangement, are not originally designed for OLR can be reckoned as a further advantage of the invention.

In a first embodiment of the invention—when a module is installed in an apparatus an electric connection is made between the apparatus and the module by the contact of two contact elements. A first contact element belongs to the apparatus and is connected to the power supply unit thereof. It is fitted with a device for current limitation, in order to permit online replacement of the module which protects the latter against excessively high current peaks. The other contact element, which is constructed as a mating component to the first contact element, belongs to the module and constitutes the supply input thereof. The two contact elements are configured in this case such that, when the module is installed in the apparatus, the contact between the contact elements which is thereby made firstly produces an electric connection, limited as to the possible current strength by the arrangement for current limitation, between the power supply unit and the input of the module. A connection with the elimination of the current limitation is produced only a short time after the first contact between the contact elements.

It is expedient in this case—that the contact element in the apparatus is constructed together with the arrangement for current limitation as an exchangeable unit. It is particularly advantageous in this case—if this unit is constructed such that, upon its installation, it is also connected to the power supply unit of the apparatus without additional wiring. Exchanging the unit, for example after damage, involves, inter alia, much less complexity and cost-than would be the case for a conventional current-limitation device, which is inside the module. Straightforward exchangeability of the unit comprising a contact element and the current-limiting device is ensured, for example— when the exchangeable unit is fastened in the apparatus by means of a screwed connection.

In one embodiment of the invention—one of the two contact elements comprises two mutually insulated subregions which, upon insertion of the module into the apparatus, come into contact sequentially in time with the other contact element. In this case, the subregion which is the first to make contact makes a connection between the apparatus and the module in conjunction with current limitation, while the second subregion, which makes contact thereafter, makes a direct connection in conjunction with the elimination of the current limitation. This embodiment of the invention represents a very simple and cost-effective solution, since switching the current-limiting device on and off is performed directly, by the temporally offset contact between the two subregions when the connection is made between the apparatus and the module, without this requiring additional switches or control devices.

In an alternative embodiment of the arrangement according to the invention—the apparatus is provided with two contact elements, of which one is conductively connected to the module and the other is conductively connected to the power supply unit of the apparatus. The connection of the module to the power supply unit is performed by means of a connecting element which conductively connects the two contact elements and to which the device for current limitation also belongs. This connecting element can be removed, as a result of which the voltage supply of the module can be interrupted. The two contact elements and the connecting element are configured such that, upon connection of the connecting element to the two contact elements, an electric connection is built up between the apparatus and the supply input of the module, in the case of which the possible current strength is initially limited by the device for current limitation before a connection is made, with a time delay, in conjunction with the elimination of the current limitation. A particular advantage of this configuration of the invention consists in that a module can be installed in the apparatus in a de-energized fashion by removal of the connecting element and thus interruption of the voltage supply for the module. With an apparatus in which a plurality of modules can be installed and/or connected, connecting elements are required only for those slots for modules which are actually filled. This means that no further costs arise for empty slots.

In one expedient embodiment—the two contact elements are constructed as busbars with integrally formed contact tongues, and the connecting element constitutes a plug-in coupling which is plugged onto the contact tongues. Simple and quick installation and removal of the connecting element is thereby rendered possible.

It is expedient in this case—that the device for current limitation is integrated into the connecting element, which is constructed as a plug-in coupling.

In particular, it is possible in the case—for the plug-in coupling to contain two mutually insulated contact bridges for electrically connecting the two busbars, a first contact bridge constituting a shorting jumper, while the device for current limitation is integrated into the second contact bridge. The contact bridges are respectively constructed as leading and trailing contacts, with the result that, when the plug-in coupling is plugged onto the contact tongues of the two busbars, first of all the second contact bridge makes contact with the contact tongues of the busbars, an electric connection of limited possible current strength being made between the busbars by the device for current limitation. It is only thereafter that the shorting jumper also make contact with the contact tongues, an electric connection then being made between the two busbars in conjunction with elimination of the current limitation.

In one embodiment of the invention—the first contact element is constructed as a busbar in the form of a flat bar on which soldering pins are integrally formed on one longitudinal edge for the purpose of connection to a printed circuit board making an electric connection to the module, and at least one contact tongue is integrally formed on one end of the other longitudinal edge.

In accordance with one development of the arrangement according to the invention—apart from the contact tongue, there is integrally formed on the contact element which is constructed as a busbar a further tongue, which, when the connecting element which is constructed as a plug-in coupling is plugged on, fits into a specific cutout in the housing of said connecting elements, thus providing reverse voltage protection against an incorrect plugging-on operation.

The arrangement for current limitation can—as be designed, independently of the specific embodiment of the arrangement, such that, upon installation of the module, said arrangement, in addition to its current-attenuating function, additionally acts as a fuse and in so doing interrupts the electric connection just made between the apparatus and the module when a maximum current strength is exceeded. This prevents damage to the apparatus or to the module by voltage peaks which are caused, for example inductively, during installation and would lead to excessive current strengths despite the current-limiting action of the corresponding arrangement.

In this case, the current-limiting device can be implemented—by an inductively acting arrangement. Even when dimensioned for high currents, corresponding inductors (chokes) occupy only a small amount of space and, compared with a corresponding ohmic series resistor for example, also generate much smaller power losses which are to be dissipated as heat.

In the case of such a use of current-limiting inductors, it is expedient that—the inductively acting arrangement is supplemented by a freewheeling diode which is connected in parallel therewith and in the blocking direction with respect to the direction of flow of the current flowing via this parallel circuit. If, as described above, upon installation of the module, a direct connection is then made between the power supply unit of the apparatus and the supply input of the module, the freewheeling diode ensures short circuiting of the inductor and thus results in rapid reduction in the magnetic field which is built up therein. Undesired disturbing pulses emanating from the inductor are thereby largely intercepted.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

Details of the invention are explained in more detail below with the aid of exemplary embodiments and with reference to drawings, in which.

DESCRIPTION OF THE PREFERRED EMBODIMENTS

Figure 1:
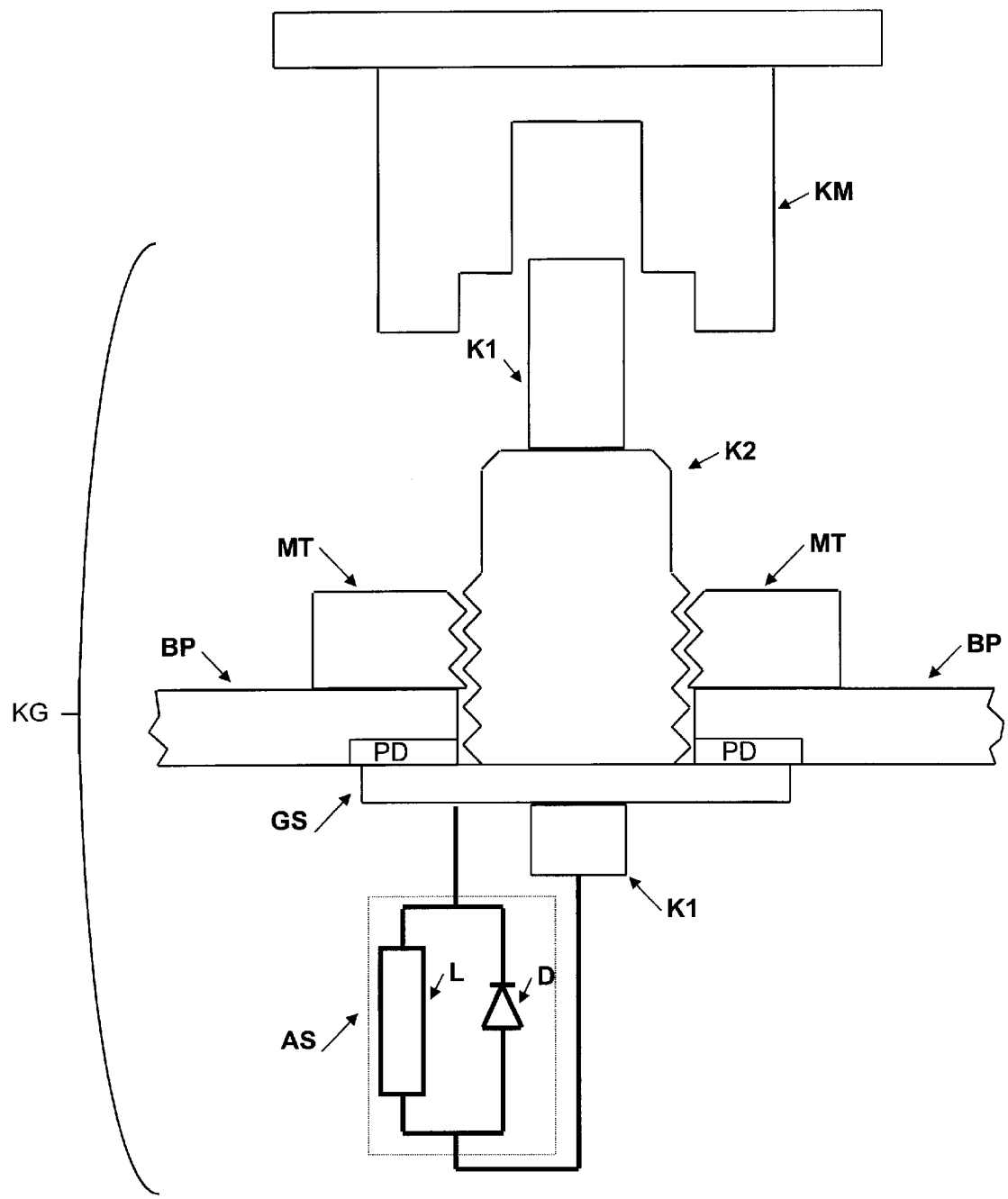
FIG. 1 shows a side view of the structure of an arrangement for connecting a module in accordance with a first embodiment of the invention.

Represented in FIG. 1 is an arrangement according to the invention which comprises a first contact element KG, belonging to an apparatus, and a second contact element KM, belonging to a module. The contact element KG is installed in a backplane BP of the apparatus by means of a screwed connection having a nut MT and a mating component GS. The contact element KG has two electrically conductive, mutually insulated subregions K1 and K2 which serve to make an electric connection to the contact element KM of the module and, together therewith, constitute a plug-in connection between the apparatus and the module. In this arrangement, one subregion K1 is constructed as a leading pin and makes contact with the contact element KM of the module, upon assembly of the plug-in connection, at an appropriately earlier point in time than the other subregion K2. The subregions K1 and/or K2 may each comprise a plurality of individual contacts/pins. The contact element KG, that is to say its subregion K2 in particular, is connected to a power supply unit of the apparatus without additional wiring by means of the mating component GS via a pad located on the backplane BP. An arrangement AS for current limitation, which is constructed as a parallel circuit comprising a choke L, acting as an inductor, and a diode D, is connected between the two mutually insulated subregions K1 and K2. With the associated arrangement AS for current limitation, the contact element KG constitutes a unit which can be exchanged easily and quickly.

Figure 2:
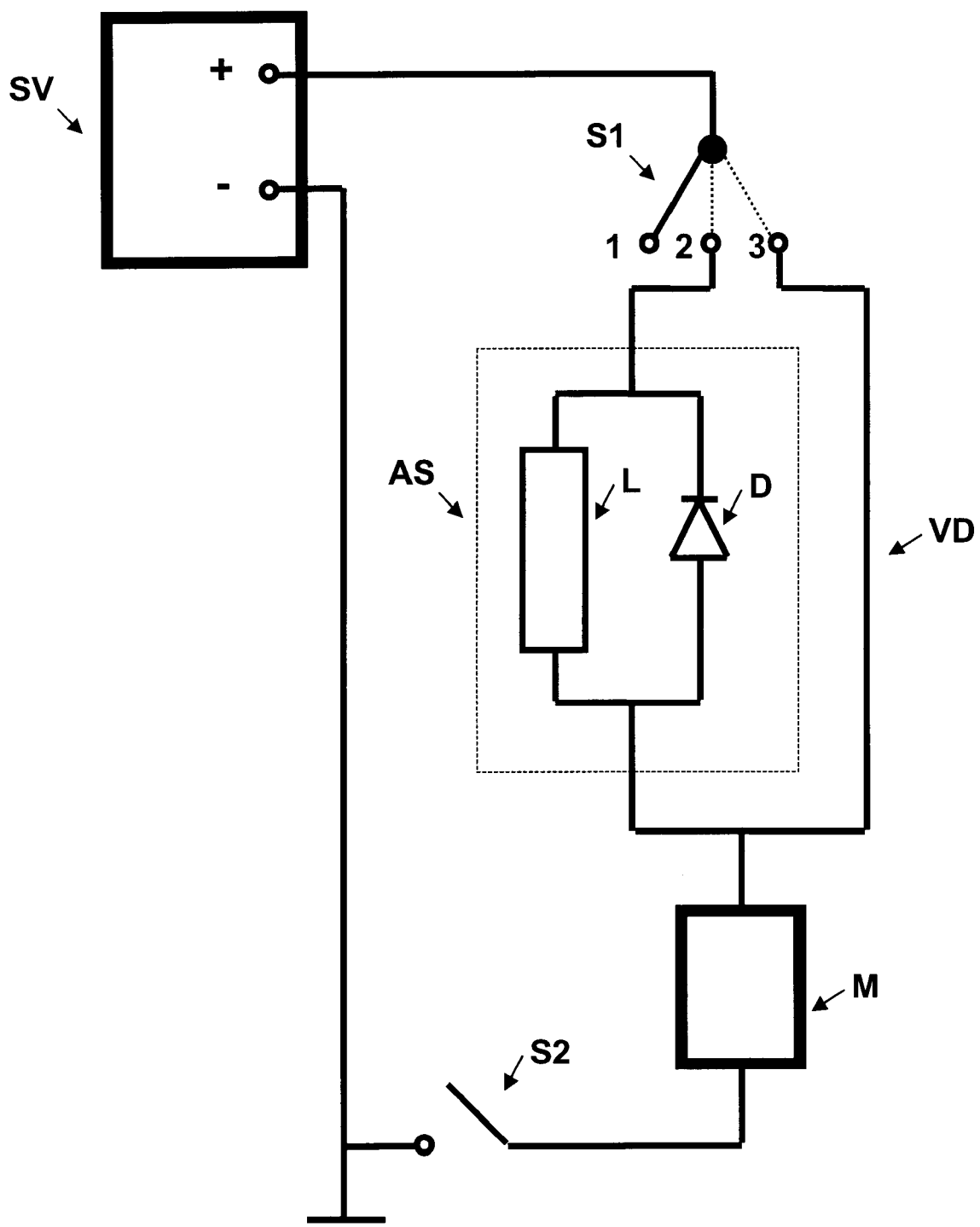
FIG. 2 shows an equivalent circuit diagram of the arrangement for explaining its mode of functioning.

The mode of functioning of the arrangement according to the invention is explained below with the aid of an equivalent circuit diagram represented in FIG. 2:

The situation before the installation of a module M in an apparatus corresponds, in the equivalent circuit diagram, to a state in which the two switches S1 and S2 are open (position 1 for S1). The module M has been completely disconnected from a power supply unit SV of the apparatus in this case. When the module is installed, first of all a ground connection of the module M to the corresponding output of the power supply unit SV is made, for example via the module housing or special contacts (not represented in FIG. 1). This corresponds to a closing of the switch S2.

The next step is to make contact between a leading pin, constituting the subregion K1, and the contact element KM of the module. In FIG. 2, this is equivalent to changing the position of the switch S1 from position 1 to 2. A live connection between the module M and the power supply unit SV of the apparatus is thereby made for the first time. The arrangement AS imposes an upper limit on the possible strength of the current flowing via this connection. Apart from the ohmic resistance of the choke L, the current-limiting device chiefly comprises the inductive resistance thereof which occurs immediately after the switch S1 is closed. Possible current peaks which could occur when the contact elements KM and KG first come into contact, or upon closure of the switch S1, are thereby attenuated. The currents which flow serve essentially to charge capacitors in the module M. The diode D is connected in the blocking direction and therefore plays no role at this point in time. If the strength of the making current exceeds a permitted maximum value despite the attenuation, then the correspondingly dimensioned choke L is destroyed, that is to say is blown, this choke in this case serving as a type of fuse for the module M. The damage can easily be rectified by quick and cost-effective exchange of the contact element, KG, which is screwed into the backplane BP.

During the plugging-in operation, by means of which the module M is installed in the apparatus, a short time (a few milliseconds to tenths of a second) after the first contact is made with the leading pin K1 contact is also made between the subregion K2 and the contact element KM of the module. In FIG. 2, this corresponds to changing over the switch S1 to position 3, although the arrangement AS can also continue to remain connected to the power supply unit SV. This makes a direct connection VD between the power supply unit SV and the supply input of the module M, while bypassing the current-limiting device AS. Since the capacitors inside the module have already largely attained their operating state (charged state) at this instant, no dangerous current peaks occur and the power supply unit of the other units/modules present in the apparatus is not overloaded. The magnetic field built up in the choke L is reduced by the short circuiting of the inductor L via the freewheeling diode D, which is now connected in the direction of the discharging current.

Upon removal of a module, the live connection between the module and the apparatus is not broken suddenly but with the temporal "interposition" of the current-limiting device. The current strength at which the connection is actually interrupted has therefore already been greatly reduced by the current-limiting device. The load on the contact elements due to striking sparks or erosion is correspondingly lower than in the case of the connection being opened immediately without the interposition of the current-limiting device.

Figure 3:
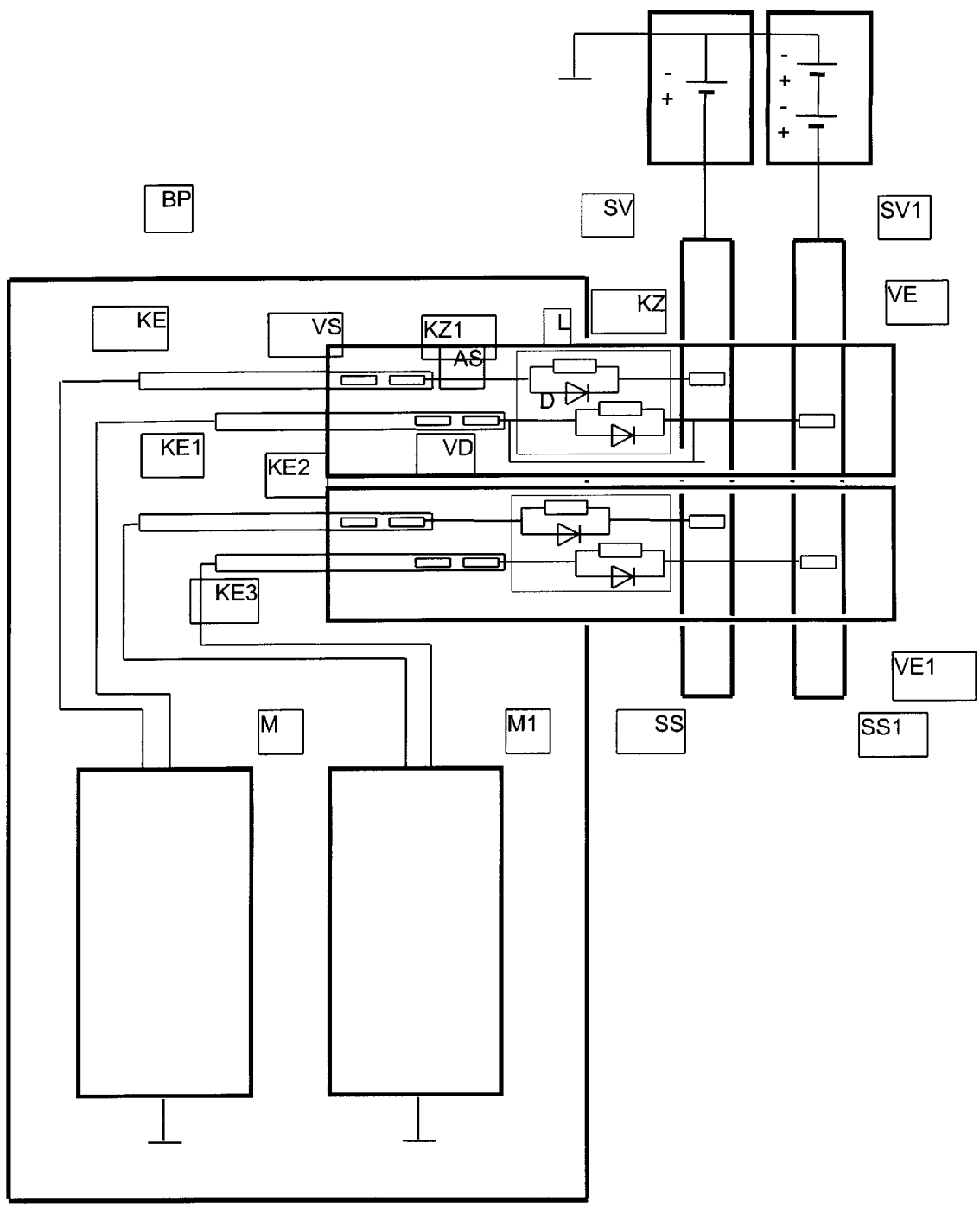
FIG. 3 shows a plan view of the structure of an arrangement for connecting a module in accordance with another embodiment of the invention.

FIG. 3 shows a plan view of another development of the invention. The drawing shows two modules M and M1 of an apparatus, which are each installed in a slot in a backplane BP of the apparatus.

In the example, the two modules M and M1 respectively require two different supply voltages. They therefore each have two supply inputs, which are each conductively connected to a contact element KE, KE1 and KE2, KE3, respectively, on the backplane BP. The corresponding supply voltages are generated in the apparatus by the power or voltage supply units SV and SV1, and the contact elements, constructed as busbars SS and SS1, respectively, are connected thereto as distributors. The electric connection of the modules M and M1 is performed in each case by a connecting element VE and VE1, respectively, which is plugged onto a corresponding contact tongue KZ and KZ1, respectively, each on one of the contact elements KE to KE3 and a busbar SS and SS1, respectively. In this case, the connecting elements VE and VE1 each contain a device AS for current limitation, which comprises, for example, (per supply voltage) a choke L with a parallel-connected freewheeling diode D. The plug-in contacts between the connecting elements and the contact tongues KZ and KZ1, respectively, are constructed as leading and trailing contacts such that, when a connecting element VE and VE1, respectively, is plugged on, first of all an electric connection is made between the corresponding module M and M1 and the power supply units SV and SV1, respectively, this connection having its possible current: strength limited by the device AS for current limitation. It is only shortly thereafter, when the connecting elements are fully plugged in, that a direct connection VD (illustrated only for the branch with the contact element KE1) is made in conjunction with the elimination or bypassing of the current-limiting device.

Also provided in each case on the contact elements KE to KE3 is an elevation VS which engages in a depression in the connecting element and constitutes reverse voltage protection against incorrect plugging on of the connecting elements VE and EV1.

Figure 4:
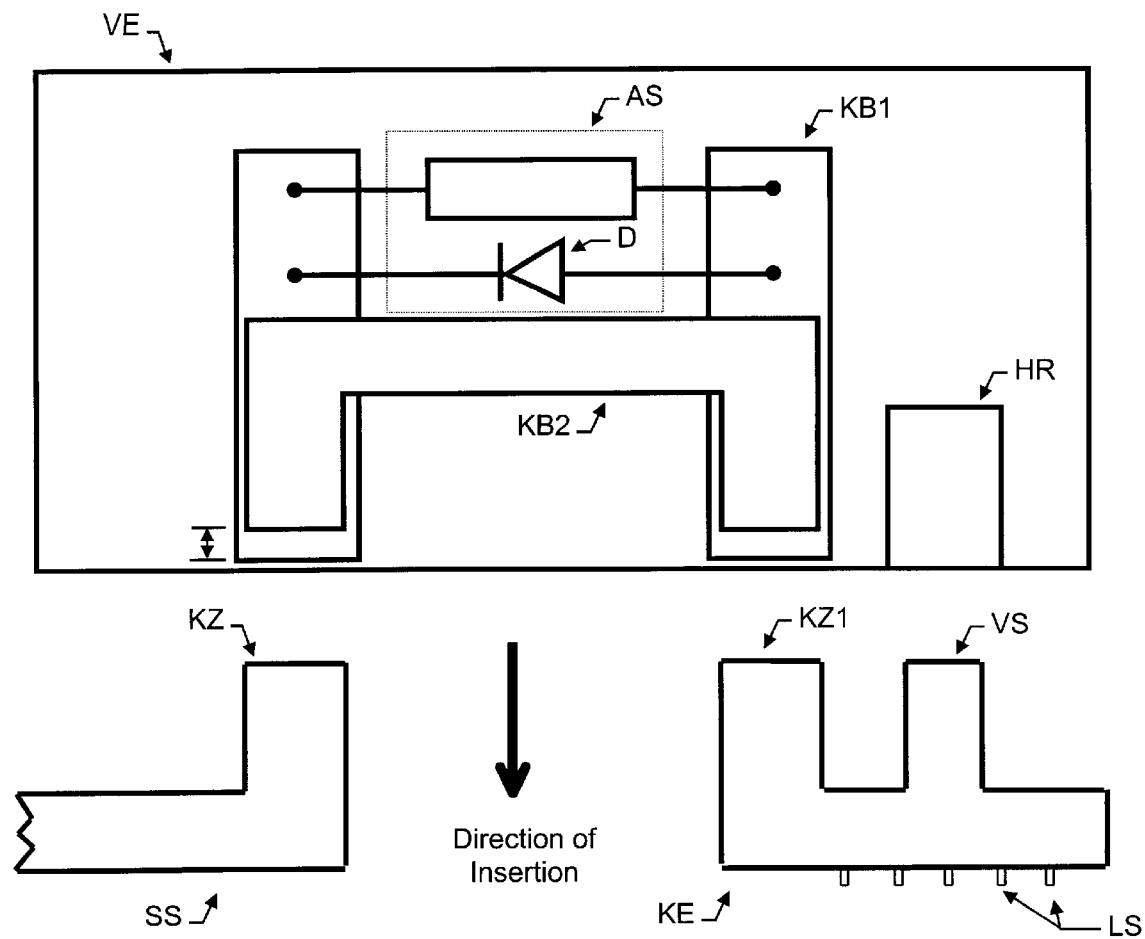
FIG. 4 shows a side view of the connecting element, which is constructed as a plug-in coupling, and of the two contact elements constructed as busbars.

A connecting element VE, which is constructed as a plug-in coupling, is represented in more detail in a side view in FIG. 4. Integrated in the housing of the plug-in coupling in a mutually insulated fashion are a contact bridge KB1, which contains the device AS for current limitation, and a shorting jumper KB2. When the connecting element VE is plugged onto the busbars SS and KE, the two contact bridges make an electric connection between the two busbars SS and KE, the contact tongues KZ and KZ1, which are integrally formed on the two busbars SS and KE respectively, engaging in the connecting element VE and making contact there one after another with the jumpers KB1 and KB2. In this case, the contact points of the shorting jumper KB2 are constructed as contacts which trail with respect to those of the other contact bridge KB1, by virtue of the fact that they are set back by a distance d into the interior of the plug-in-coupling housing. Consequently, when the connecting element VE is plugged onto the busbars SS and KE, first of all there is only a current-limited connection, before the shorting jumper KB2 also comes into contact with the contact tongues KZ and KZ1 and a direct conductive connection is made. The busbar KE is fitted on a longitudinal edge with soldering pins LS by means of which it is soldered into a backplane, for example the backplane of a computer. In addition to the contact tongue KZ1, the busbar has a further tongue VS, which engages in a special cutout HR in the plug-in coupling housing when the plug-in coupling is plugged on, thus producing reverse voltage protection against a polarity reversal of the diode D associated with the plug-in coupling being plugged on in the reverse fashion.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An arrangement for connecting at least one module to a power supply unit in an apparatus such that a connection is provided while the power supply unit is switched on, comprising:

at least one contact element which is located outside the module and has a leading contact; and the contact element having a device for current limitation which is connected to the leading contact and is shorted by a non-leading contact.

2. The arrangement as claimed in claim 1, wherein the contact element is fastened to the apparatus, the module has a mating contact, and the contact element and mating contact are interconnected when the module is inserted into the apparatus.

3. The arrangement as claimed in claim 2, wherein the contact element is constructed together with the device belonging thereto for current limitation as an exchangeable unit.

4. The arrangement as claimed in claim 3, wherein, upon installation of the exchangeable unit, the unit is also connected to the power supply unit of the apparatus without additional wiring.

5. The arrangement as claimed in claim 3, wherein the contact element is fastenable in the apparatus as an exchangeable unit by a screwed connection.

6. The arrangement as claimed in claim 2, wherein the contact element has two mutually insulated subregions which, upon insertion of the module into the apparatus, come into contact sequentially in time with the mating contact, a first subregion of the two mutually insulated subregions, which is the first to make contact, making a connection between the apparatus and the module in conjunction with current limitation, while the second subregion of the two mutually insulated subregions, which makes contact thereafter, makes a connection in conjunction with elimination of the current limitation.

7. The arrangement as claimed in claim 1, wherein the apparatus has first and second contact elements, of which the first contact element is conductively connected to the module and the second contact element is conductively connected to the power supply unit of the apparatus;

wherein the first and second contact elements are connected by a removable connecting element to which the device for current limitation also belongs;

wherein the connecting element and the first and second contact elements are configured such that, upon connection of the connecting element to the first and second contact elements, an electric connection is built up between the apparatus and a supply input of the module, current strength being initially limited by the device for current limitation before a connection is made in conjunction with the elimination of the current limitation.

8. The arrangement as claimed in claim 7, wherein the first and second contact elements are busbars with integrally formed contact tongues, and the connecting element is a plug-in coupling which is pluggable onto the contact tongues.

9. The arrangement as claimed in claim 8, wherein the device for current limitation is integrated into the connecting element, which is a plug-in coupling.

10. The arrangement as claimed in claim 9, the plug-in coupling contains mutually insulated first and second contact bridges for electrically connecting the two busbars, and the device for current limitation is integrated into the first contact bridge, and the second contact bridge is a shorting jumper; and wherein each of the contact bridges are structured such that, when the plug-in coupling is plugged onto the contact tongues of the two busbars, initially the first contact bridge makes contact with the contact tongues of the busbars, an electric connection of limited current strength being made between the busbars by the device for current limitation, and thereafter the shorting jumper makes contact with the contact tongues, an electric connection being made between the two busbars in conjunction with elimination of current limitation.

11. The arrangement as claimed in claim 8, wherein the first contact element is a busbar in a form of a flat bar on which soldering pins are integrally formed on one longitudinal edge of the flat bar for connection to a printed circuit board that makes an electric connection to the module, and wherein at least one contact tongue is integrally formed on one end of the other longitudinal edge of the flat bar.

12. The arrangement as claimed in claim 8, wherein apart from the contact tongue, there is integrally formed on the contact element, which is a busbar, a further tongue, which, when the connecting element which is a plug-in coupling, is plugged on, engages in a cutout in a housing of said connecting element, thus providing reverse voltage protection.

13. The arrangement as claimed in claim 1, wherein the device for current limitation is structured such that, during installation of the module, the device serves additionally as a fuse and in so doing interrupts an electric connection just made between the power supply unit and the module upon overshooting of a maximum current strength.

14. The arrangement as claimed in claim 1, wherein the current limitation is implemented by an inductively acting device.

15. The arrangement as claimed in claim 14, wherein the inductively acting device is supplemented by a free wheeling diode which is connected in parallel therewith and in a blocking direction with respect to direction of flow of current flowing via this parallel circuit.

* * * * *